United States Patent
Hibbs, Jr.

[11] 4,032,853
[45] June 28, 1977

[54] OVERDRIVE DETECTOR FOR RADIO FREQUENCY AMPLIFIER

[76] Inventor: Eugene B. Hibbs, Jr., 1206 Fernside Drive, La Canada, Calif. 91001

[22] Filed: Oct. 28, 1976

[21] Appl. No.: 736,385

[52] U.S. Cl. .................................. 330/2; 307/351; 307/358; 325/133; 330/59; 340/248 A
[51] Int. Cl.² ...................................... G01R 19/00
[58] Field of Search ............... 307/235 A, 235 J; 325/133; 330/2, 59; 340/248 A; 324/103 P

[56] References Cited
UNITED STATES PATENTS 3,694,748   9/1972   Hekimian ..................... 324/103 P

OTHER PUBLICATIONS

Frankeny — "Drift Indicator" —IBM Technical Disclosure Bulletin vol. 14, No. 3, p. 724, Aug. 1971.

*Primary Examiner*—Rudolph V. Rolinec
*Assistant Examiner*—Lawrence J. Dahl
*Attorney, Agent, or Firm*—Blakely, Sokoloff, Taylor & Zafman

[57] ABSTRACT

A relatively simple, inexpensive, effective circuit for detecting overdriving of a radio frequency amplifier by an amplitude modulated signal. The input and output signals of the amplifier are coupled to peak detectors. A light emitting diode which provides a visual indication of the overdrive condition is coupled between the peak detectors.

11 Claims, 1 Drawing Figure

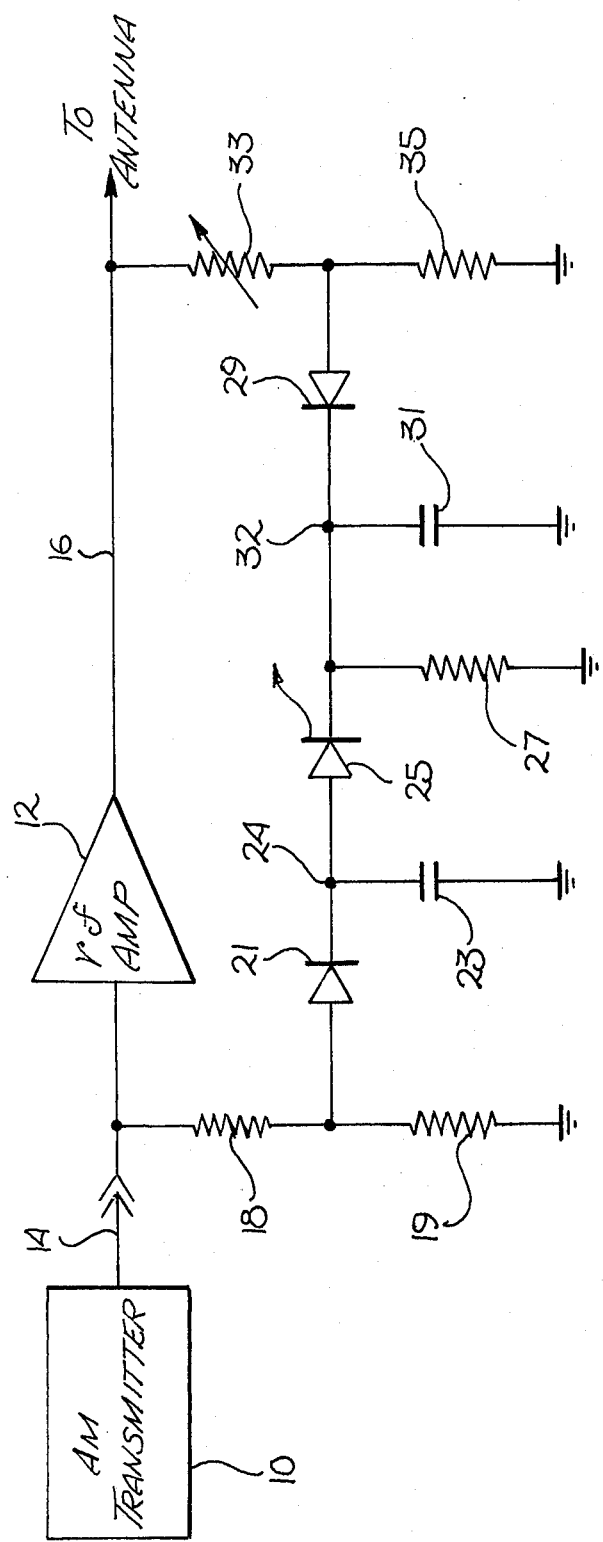

OVERDRIVE DETECTOR FOR RADIO FREQUENCY AMPLIFIER

BACKGROUND OF THE INVENTION:

1. Field of the Invention

The invention relates to circuits for detecting overdriving of radio frequency amplifiers.

2. Prior Art

In some applications separte radio frequency amplifiers are used to amplify the output of an amplitude modulated (AM) transmitter. For example, the output from a transmitter may not be sufficient for a particular application, such as for boating, aircraft, police communications, or amateur radio use, thus necessitating the use of a separate amplifier. Such amplifiers are commercially available including so-called "bilinear" amplifiers which amplify both the transmitted and received signal.

It is generally desirable to obtain as much output power as possible from these radio frequency amplifier. However, since the input to the amplifier (output of the transmitter) is not constant and varies with the amount of modulation and other variables, the amplifier can quite easily be overdriven. When this occurs, the output signal is clipped causing considerable distortion. It is thus desirable to know when the amplifier is being overdriven. Corrective steps may then be taken to present such overdriving; for example, the input signal level to the radio frequency amplifier may be reduced.

As will be seen, the presently disclosed circuit provides a relatively simple, inexpensive, yet very effective circuit for detecting an overdrive condition in a radio frequency amplifier.

SUMMARY OF THE INVENTION

A circuit for detecting the overdriving of a radio frequency amplifier by an AM signal is described. A first peak detection circuit is coupled to the input of the amplifier through a voltage divider. This detection circuit provides a direct current (DC) potential which is proportional to the input signal to the amplifier. A second peak detection circuit is coupled to the amplifier output through a second voltage divider. This peak detection circuit also provides a DC potential which potential is proportional to the output of the amplifier. A light emitting diode is coupled between the first and second peak detection circuits. The circuit is initially adjusted such that the light emitting diode does not conduct for the maximum, distortion free, output of the amplifier. If the amplitude of the input signal increases (beyond that required to obtain the maximum output), current flows through the light emitting diode thereby giving a visual indication of the overdriving of the amplifier.

BRIEF DESCRIPTION OF THE DRAWING:

The drawing is an electrical schematic of the presently preferred circuit for detecting the overdriving of a radio frequency amplifier.

DETAILED DESCRIPTION OF THE INVENTION:

The presently preferred embodiment of a circuit for detecting the overdriving of a radio frequency amplifier is described. It will be apparent to one skilled in the art that the inventive concepts disclosed in this application may be employed in other embodiments.

In the FIGURE, an AM transmitter 10 is shown coupled to a radio frequency amplifier 12 by a line 14. The output of the radio frequency amplifier 12, line 16, is typically coupled to an antenna. As previously described, it is generally desirable to obtain as large an output from amplifier 12 as is possible, without distortion. In attempting to achieve a maximum output from amplifier 12, under some conditions, the transmitter 10 is likely to overdrive the amplifier 12. When this occurs the output of the amplifier 12 will be clipped and considerable distortion will be introduced into the transmitted signal. Thus, it is desirable to have some indication of the overdriving of amplifier 12. When overdriving occurs, the amplitude of the signal coupled to the amplifier 12 by line 14 may be reduced to eliminate the overdriving, and hence the distortion. For example, a rheostat may be coupled along line 14 or within the transmitter 10 to reduce the signal applied to the input of the amplifier 12.

A voltage divider comprising resistors 18 and 19 is coupled between the input terminal of amplifier 12 and ground. This voltage divider is coupled to one terminal of a diode 21. The other terminal of diode 21 (node 24) is coupled to ground through a capacitor 23.

Similarly, the output of the amplifier 12 is coupled to a voltage divider which comprises a variable resistor 33 and a resistor 35. This voltage divider is coupled to one terminal of the diode 29. The other terminal of this diode (node 32) is coupled to ground through capacitor 31.

A light emitting diode 25 is coupled between nodes 24 and 32. Node 32 is also coupled to ground through a resistor 27.

The diode 21 and capacitor 23 form a peak detector which provides a positive direct current potential on node 24. This DC potential is a function of the amplitude of the input signal to amplifier 12. Similarly, the diode 29 and capacitor 31 form a peak detector which provides a positive direct current potential on node 32. This potential is a function of the amplitude of the output signal of amplifier 12.

Assume for sake of discussion that when the amplifier 12 is coupled to an antenna, its maximum output potential (peak) without distortion is 70 volts and that to obtain this maximum output, an input potential (peak) of approximately 17 volts is required. The resistor 33 is adjusted for these conditions such that the potential between nodes 24 and 32 is less than or approximately equal to the (forward) threshold voltage of the diode 25. Thus, for these conditions, current does not flow through the diode 25. Assume now that the amplifier 12 is overdriven, that is, that the amplitude of the input signal to the amplifier increases above 17 volts. This increase potential at the input of amplifier 12 causes the potential on node 24 to rise. When the potential on node 24 rises above the threshold voltage of the diode 25, current flows from the node 24 through the diode and through resistor 27 to ground. Note that even though the input to the amplfier 12 was increased, the potential on node 32 remains substantially unchanged since the signal peaks detected by diode 29 and capacitor 31 remain constant even though the amplifier is being overdriven. Thus, when the amplifier 12 is overdriven current flows through the light emitting diode 25, thereby providing a visual indication of the overdriving.

If a smaller input signal than that required for the maximum output is applied to amplifier 12, the potential on nodes 24 and 32 both decrease and light is not emitted from diode 25.

The light emitting diode 25 in addition to providing a visual indication of the overdriving, also provides a predetermined threshold voltage which must be overcome before current flows through the diode. This threshold voltage prevents flickering. It is apparent that other threshold means may be used in lieu of diode 25, for example, an ordinary diode may be employed in series with a light bulb.

Thus, a relatively simple, inexpensive and yet effective circuit for detecting the overdriving of amplifier 12 has been described.

I claim:

1. A circuit for detecting the overdriving of a radio frequency amplifier comprising:
   a first detection means coupled to the input of said amplifier for providing a first potential, which potential is a function of the input signal to said amplifiers;
   a second detection means coupled to the output of said amplifier for providing a second potential, which potential is a function of the output signal from said amplifier;
   threshold means coupled between said first and second potentials for providing a current path when the difference between said first and second potential exceeds a predetermined voltage;
   whereby current in said threshold means provides an indication of the overdriving of said amplifier.

2. The circuit defined by claim 1 wherein said first potential and said second potential are direct current potentials.

3. The circuit defined by claim 2 wherein said first and said second detection means are each peak detectors.

4. The circuit defined by claim 3 wherein said threshold means comprises a light emitting diode.

5. The circuit defined by claim 4 including adjustable means for adjusting the level of at least one of said first and second potentials.

6. The circuit defined by claim 5 wherein said adjustable means comprises a variable resistance.

7. The circuit defined by claim 1 wherein said first detection means and second detection means each comprise a diode and a capacitor.

8. A circuit for detecting the overdriving of a radio frequency amplifier comprising:
   a first voltage divider coupled to the input of said amplifier;
   a second voltage divider coupled to the output of said amplifier;
   a first peak detector coupled to said first voltage divider;
   a second peak detector coupled to said second voltage divider;
   a light emitting diode coupled between said first and second peak detector;
   whereby a visual indication of the overdriving of said amplifier is given by said light emitting diode.

9. The circuit defined by claim 8 wherein each of said peak detectors comprises a diode and a capacitor.

10. The circuit defined by claim 9 including a resistor coupled to said light emitting diode for providing a current path for said diode.

11. The circuit defined by claim 10 wherein one of said first and second voltage dividers includes a variable resistor.

* * * * *